United States Patent
Yu

(10) Patent No.: US 9,899,599 B2
(45) Date of Patent: Feb. 20, 2018

(54) MANUFACTURING METHODS OF FLEXIBLE DISPLAY PANELS AND THE SUBSTRATE COMPONENTS THEREOF

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 119 days.

(21) Appl. No.: 14/889,126

(22) PCT Filed: Aug. 25, 2015

(86) PCT No.: PCT/CN2015/088021
§ 371 (c)(1),
(2) Date: Nov. 4, 2015

(87) PCT Pub. No.: WO2017/020370
PCT Pub. Date: Feb. 9, 2017

(65) Prior Publication Data
US 2017/0170396 A1 Jun. 15, 2017

(30) Foreign Application Priority Data
Aug. 5, 2015 (CN) .......................... 2015 1 0474372

(51) Int. Cl.
*H01L 21/00* (2006.01)
*H01L 51/00* (2006.01)
*H01L 51/56* (2006.01)

(52) U.S. Cl.
CPC ........ *H01L 51/003* (2013.01); *H01L 51/0097* (2013.01); *H01L 51/56* (2013.01); *H01L 2251/5338* (2013.01)

(58) Field of Classification Search
CPC .... H01L 51/003; H01L 51/0097; H01L 51/56
See application file for complete search history.

(56) References Cited

U.S. PATENT DOCUMENTS 9,142,807 B2 * 9/2015 Zeng ..................... H01L 51/56
2006/0254704 A1 11/2006 Seo et al.
(Continued)

FOREIGN PATENT DOCUMENTS

| CN | 103515313 A | 1/2014 |
|---|---|---|
| CN | 103531442 A | 1/2014 |
| CN | 104143499 A | 11/2014 |

*Primary Examiner* — Richard Booth
(74) *Attorney, Agent, or Firm* — Andrew C. Cheng

(57) ABSTRACT

A manufacturing method of flexible display panels and the substrate components thereof are disclosed. The method includes: providing a rigid substrate and a flexible substrate; forming a sealed plastic frame on the rigid substrate and/or flexible substrate; within a vacuum environment, bonding the rigid substrate with the flexible substrate and curing the sealed plastic frame to fix the flexible substrate on the rigid substrate, after taken out from the vacuum environment, an area of the flexible substrate within the sealed plastic frame is adhered to the rigid substrate due to negative pressure; forming at least one display component on the flexible substrate; and cutting the rigid substrate and/or the flexible substrate to separate the flexible substrate and the rigid substrate. In this way, the components are prevented from being failed when the flexible substrate is stripped during the manufacturing process of the flexible substrate.

8 Claims, 2 Drawing Sheets

(56) References Cited

U.S. PATENT DOCUMENTS

| | | |
|---|---|---|
| 2010/0279576 A1 | 11/2010 | Kim |
| 2014/0134913 A1 | 5/2014 | Yeo et al. |
| 2015/0171376 A1 | 6/2015 | Zeng et al. |
| 2015/0188096 A1 | 7/2015 | Zeng et al. |
| 2017/0133639 A1 | 5/2017 | Yu |

* cited by examiner

MANUFACTURING METHODS OF FLEXIBLE DISPLAY PANELS AND THE SUBSTRATE COMPONENTS THEREOF

BACKGROUND OF THE INVENTION

1. Field of the Invention

The present disclosure relates to liquid crystal display technology, and more particularly to a manufacturing method of flexible display panels and the substrate components thereof.

2. Discussion of the Related Art

Organic Light-Emitting Diode (OLED) displays are newly developed display devices characterized by attributes, such as self-luminescent, high brightness, wide viewing angle, low power consumption, and flexible, and thus have been adopted in cellular phones and televisions. The backlight is not needed for OLED substrate, and the organic materials may emit light beams by electrifying the organic materials on the glass. The thin and self-luminescent attributes contribute to the flexibility of the organic materials. Currently, the plastic substrate, such as PEN or PET, may be adopted. However, as the plastic substrate may deform and thus cannot be manufactured alone. As shown in FIG. 1, the plastic substrate 12 adheres to the glass substrate 11 via glue 13. Afterward, the manufacturing process is finished on the plastic substrate 12. In the end, the plastic substrate 12 is striped off from the glass substrate 11 so as to obtain the flexible OLED panels. During the stripping process, as the plastic substrate 12 may be bent, the films and the components on the plastic substrate 12 may be damaged.

SUMMARY

The object of the invention is to provide a manufacturing method of flexible display panels and the substrate components thereof. With such configuration, the components are prevented from being failed when the flexible substrate is stripped during the manufacturing process of the flexible substrate.

In one aspect, a manufacturing method of flexible display panels includes: providing a rigid substrate and a flexible substrate; forming a sealed plastic frame on the rigid substrate and/or flexible substrate; within a vacuum environment, bonding the rigid substrate with the flexible substrate and curing the sealed plastic frame to fix the flexible substrate on the rigid substrate by the sealed plastic frame, after the rigid substrate and the flexible substrate are taken out from the vacuum environment, an area of the flexible substrate within the sealed plastic frame is adhered to the rigid substrate due to negative pressure; forming at least one display component on the flexible substrate; cutting the rigid substrate and/or the flexible substrate to separate the flexible substrate and the rigid substrate; and wherein a surface of the rigid substrate includes a plurality of supporting pillars spaced apart from each other, the sealed plastic frame is formed in a periphery of the supporting pillars, and the area of the flexible substrate within the sealed plastic frame adheres to the supporting pillars due to the negative pressure.

Wherein the rigid substrate is a glass substrate, and the supporting pillars are glass supporting pillars formed by etching the glass substrate.

Wherein the step of cutting the rigid substrate and/or the flexible substrate further includes cutting the flexible substrate along an internal side of the sealed plastic frame, and the sealed plastic frame and the remaining flexible substrate are removed from the rigid substrate.

In another aspect, a manufacturing method of flexible display panels includes: providing a rigid substrate and a flexible substrate; forming a sealed plastic frame on the rigid substrate and/or flexible substrate; within a vacuum environment, bonding the rigid substrate with the flexible substrate and curing the sealed plastic frame to fix the flexible substrate on the rigid substrate by the sealed plastic frame, after the rigid substrate and the flexible substrate are taken out from the vacuum environment, the flexible substrate within an area of the sealed plastic frame is adhered to the rigid substrate due to negative pressure; forming at least one display component on the flexible substrate; and cutting the rigid substrate and/or the flexible substrate to separate the flexible substrate and the rigid substrate.

Wherein a surface of the rigid substrate includes a plurality of supporting pillars spaced apart from each other, the sealed plastic frame is formed in a periphery of the supporting pillars, and the flexible substrate within the sealed plastic frame adheres to the supporting pillars due to the negative pressure.

Wherein the rigid substrate is a glass substrate, and the supporting pillars are glass supporting pillars formed by etching the glass substrate.

Wherein the step of cutting the rigid substrate and/or the flexible substrate further includes:

cutting the flexible substrate along an internal side of the sealed plastic frame.

Wherein the step of cutting the rigid substrate and/or the flexible substrate further includes:

cutting the flexible substrate along an internal side of the sealed plastic frame, and the sealed plastic frame and the remaining flexible substrate are removed from the rigid substrate.

In another aspect, a substrate component for manufacturing flexible display panels includes: a rigid substrate, a flexible substrate, and a sealed plastic frame between the rigid substrate and the flexible substrate, the flexible substrate adheres to the rigid substrate via the sealed plastic frame, negative pressure is formed within the sealed plastic frame, and an area of the flexible substrate within the sealed plastic frame adheres to the rigid substrate due to the negative pressure.

Wherein a surface of the rigid substrate includes a plurality of supporting pillars spaced apart from each other, the sealed plastic frame is formed in a periphery of the supporting pillars, and the area of the flexible substrate within the sealed plastic frame adheres to the supporting pillars due to the negative pressure.

Wherein the rigid substrate is a glass substrate, and the supporting pillars are glass supporting pillars formed by etching the glass substrate.

Wherein the supporting pillars are arranged in a matrix, and cross-sections of the supporting pillars along the rigid substrate are square or circular.

Wherein a height of the sealed plastic frame is the same with the height of the supporting pillars.

In view of the above, the rigid substrate and/or the flexible substrate form the sealed plastic frame. Within the vacuum environment, the rigid substrate and the flexible substrate are bonded together and the sealed plastic frame is cured. As such, the flexible substrate adheres to the rigid substrate by the sealed plastic frame. In addition, after the rigid substrate and the flexible substrate are retrieved out from the vacuum environment, the flexible substrate within the sealed plastic frame adheres to the rigid substrate due to the negative pressure. The display component is formed on the flexible substrate. The rigid substrate and/or the flexible substrate are cut off so as to separate the flexible substrate and the rigid substrate. In this way, during the manufacturing process of the flexible substrate, the component are prevented from being malfunctioned caused by stripping the flexible substrate.

DETAILED DESCRIPTION OF THE EMBODIMENTS

Embodiments of the invention will now be described more fully hereinafter with reference to the accompanying drawings, in which embodiments of the invention are shown.

Figure 1:
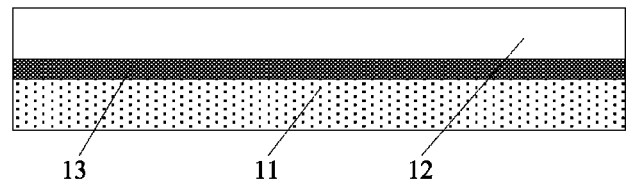
FIG. 1 is a schematic view of the manufacturing method of one conventional flexible display panel.
Figure 2:
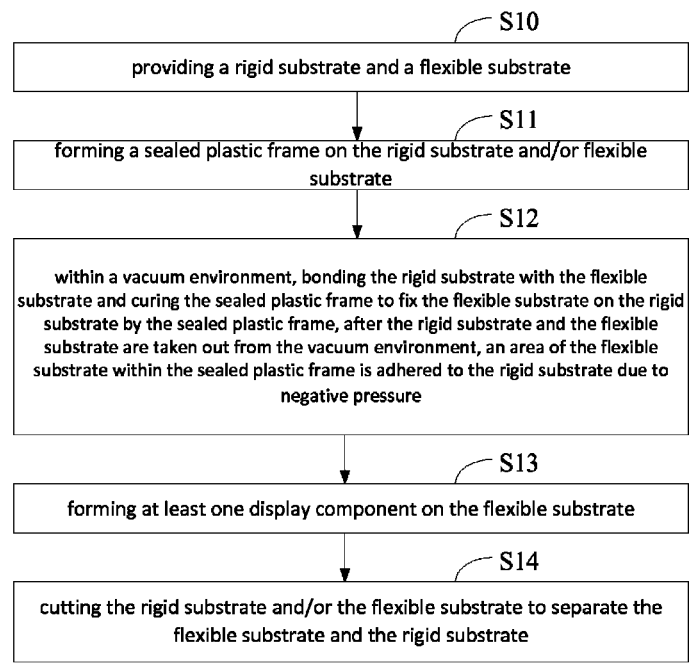
FIG. 2 is a flowchart of the manufacturing method of the flexible display panel in accordance with one embodiment.

FIG. 2 is a flowchart of the manufacturing method of the flexible display panel in accordance with one embodiment. The method includes the following steps.

In block S10, a rigid substrate and a flexible substrate are provided.

A plurality of supporting pillars are arranged between the surfaces of the rigid substrate, and the supporting pillars are spaced apart from each other. The supporting pillars may be formed by adopting a yellow light/etching process to etch the glass. The supporting pillars may be, but not limited to, circular-shaped or square-shaped. A height of a sealed plastic frame is the same with the height of the supporting pillars. The supporting pillars may be arranged in a matrix. After the etching process, the area outside the supporting pillars is directed to a thinning area.

In block S11, a sealed plastic frame is formed on the rigid substrate and/or flexible substrate.

Preferably, the sealed plastic frame may be ultraviolet rays (UV) glue, which may be cured when being radiated by UV.

In block S12, within a vacuum environment, the rigid substrate and the flexible substrate are bonded and the sealed plastic frame is cured. As such, the flexible substrate is fixed on the rigid substrate via the sealed plastic frame. In addition, after the rigid substrate and the flexible substrate are taken out from the vacuum environment, the flexible substrate within the area of the sealed plastic frame is adhered to the rigid substrate due to the negative pressure.

The negative pressure relates to the vacuum environment formed by the flexible substrate within the sealed plastic frame and the rigid substrate, and the flexible substrate adheres tightly on the rigid substrate due to the vacuum. The sealed plastic frame surrounds a periphery of the supporting pillars such that the flexible substrate within the sealed plastic frame adheres to the supporting pillars due to the negative pressure. The rigid substrate may be a glass substrate. Correspondingly, the supporting pillars may be the glass supporting pillars by etching the glass substrate. The flexible substrate may be a plastic substrate.

In block S13, the display component is formed on the flexible substrate.

In block S14, the rigid substrate and/or flexible substrate are cut so as to separate to the flexible substrate and the rigid substrate.

In block S14, the rigid substrate and/or the flexible substrate are cut along an internal side of the sealed plastic frame. As such, the vacuum environment formed between the flexible substrate and the rigid substrate may be damaged, and the flexible substrate may fall off automatically. That is, it is not needed to strip the flexible substrate. This may prevents the components from being malfunctioned when the flexible substrate is stripped off. For instance, the flexible substrate is cut off along the internal side of the sealed plastic frame, and the sealed plastic frame and the remaining flexible substrate are removed from the rigid substrate.

Figure 3:
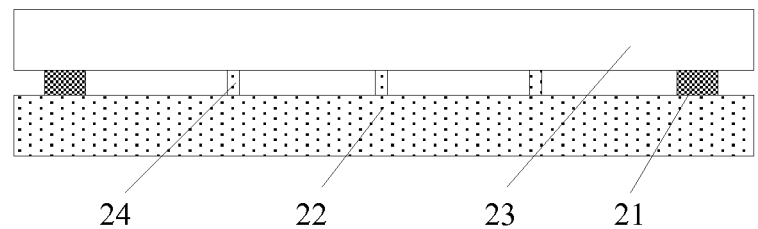
FIG. 3 is a schematic view of the substrate component for manufacturing the flexible display panel in accordance with one embodiment.

FIG. 3 is a schematic view of the substrate component for manufacturing the flexible display panel in accordance with one embodiment. As shown in FIG. 3, the substrate component 20 includes at least one rigid substrate 22, a flexible substrate 23 and the sealed plastic frame 21 between the rigid substrate 22 and the flexible substrate 23. The flexible substrate 23 adheres to the rigid substrate 22 via the sealed plastic frame 21. The negative pressure is formed within the sealed plastic frame 21 such that an area of the flexible substrate 23 within the sealed plastic frame 21 adheres to the rigid substrate 22 due to the negative pressure.

In the embodiment, the sealed plastic frame may be UV glue, and may be cured by UV rays. The surface of the rigid substrate 22 includes a plurality of supporting pillars 24 spaced apart from each other. The sealed plastic frame 21 is formed in a periphery of the supporting pillars such that the flexible substrate 23 within the sealed plastic frame 21 adheres to the supporting pillars 24 due to the negative pressure. The negative pressure relates to the vacuum environment formed by the flexible substrate 23 within the sealed plastic frame 21 and the rigid substrate 22, and the flexible substrate 23 is closely adhered to the rigid substrate 22.

Figure 4:
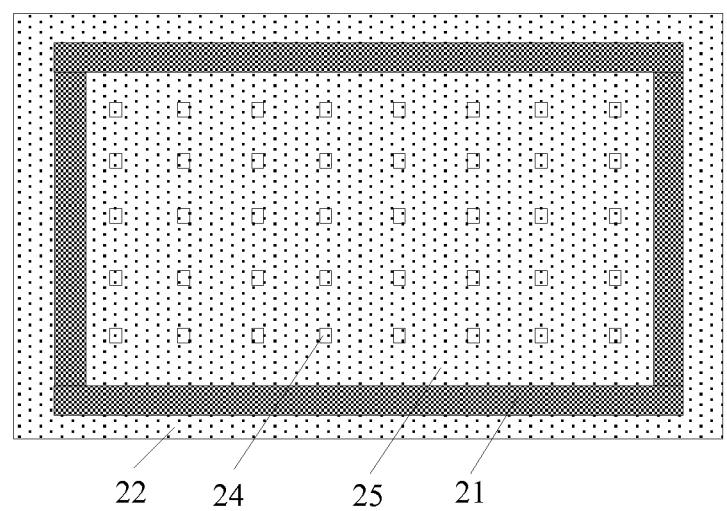
FIG. 4 is a top view of the substrate component for manufacturing the flexible display panel of FIG. 3.

The rigid substrate 22 may be a glass substrate, the supporting pillars 24 may be glass supporting pillars formed by etching the glass substrate. The flexible substrate 23 may be plastic substrate. As shown in FIG. 4, the supporting pillars 24 may be arranged in a matrix. After the etching process, the area outside the supporting pillars 24 is directed to a thinning area. In other embodiments, the supporting pillars 24 may be configured in other ways, and is not limited thereto. The cross-sections of the supporting pillars 24 along the rigid substrate 22 may be square or circular. The height of the sealed plastic frame 21 is the same with the height of the supporting pillars 24.

After the substrate component 20 is formed, the display component may be formed on the flexible substrate 23. After the display component is formed, the rigid substrate 22 and/or the flexible substrate 23 are cut off so as to separate the flexible substrate 23 and the rigid substrate 22. Specifically, the rigid substrate 22 and/or the flexible substrate 23 are cut along the internal side of the sealed plastic frame 21. As such, the vacuum environment formed between the flexible substrate 23 and the rigid substrate 22 may be damaged, and the flexible substrate 23 may fall off automatically. That is, it is not needed to strip the flexible substrate 23. This may prevents the components from being malfunctioned when the flexible substrate 23 is stripped off.

For instance, the flexible substrate 23 is cut off along the internal side of the sealed plastic frame 21, and the sealed plastic frame 21 and the remaining flexible substrate 23 are removed from the rigid substrate 22.

In view of the above, the rigid substrate and/or the flexible substrate form the sealed plastic frame. Within the vacuum environment, the rigid substrate and the flexible substrate are bonded together and the sealed plastic frame is cured. As such, the flexible substrate adheres to the rigid substrate by the sealed plastic frame. In addition, after the rigid substrate and the flexible substrate are retrieved out from the vacuum environment, the flexible substrate within the sealed plastic frame adheres to the rigid substrate due to the negative pressure. The display component is formed on the flexible substrate. The rigid substrate and/or the flexible substrate are cut off so as to separate the flexible substrate and the rigid substrate. In this way, during the manufacturing process of the flexible substrate, the component are prevented from being malfunctioned caused by stripping the flexible substrate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of flexible display panels, comprising:
    providing a rigid substrate and a flexible substrate;
    forming a sealed plastic frame on the rigid substrate and/or flexible substrate;
    within a vacuum environment, bonding the rigid substrate with the flexible substrate and curing the sealed plastic frame to fix the flexible substrate on the rigid substrate by the sealed plastic frame, after the rigid substrate and the flexible substrate are taken out from the vacuum environment, an area of the flexible substrate within the sealed plastic frame is adhered to the rigid substrate due to negative pressure of a vacuum region;
    forming at least one display component on the flexible substrate;
    cutting the rigid substrate and/or the flexible substrate to separate the flexible substrate and the rigid substrate; and
    wherein a surface of the rigid substrate comprises a plurality of supporting pillars spaced apart from each other, the sealed plastic frame is formed in a periphery of the supporting pillars, and the area of the flexible substrate within the sealed plastic frame adheres to the supporting pillars due to the negative pressure.

2. The method as claimed in claim 1, wherein the rigid substrate is a glass substrate, and the supporting pillars are glass supporting pillars formed by etching the glass substrate.

3. The method as claimed in claim 1, wherein the step of cutting the rigid substrate and/or the flexible substrate further comprises:
    cutting the flexible substrate along an internal side of the sealed plastic frame, and the sealed plastic frame and the remaining flexible substrate are removed from the rigid substrate.

4. A manufacturing method of flexible display panels, comprising:
    providing a rigid substrate and a flexible substrate;
    forming a sealed plastic frame on the rigid substrate and/or flexible substrate;
    within a vacuum environment, bonding the rigid substrate with the flexible substrate and curing the sealed plastic frame to fix the flexible substrate on the rigid substrate by the sealed plastic frame, after the rigid substrate and the flexible substrate are taken out from the vacuum environment, the flexible substrate within an area of the sealed plastic frame is adhered to the rigid substrate due to negative pressure of a vacuum region;
    forming at least one display component on the flexible substrate; and
    cutting the rigid substrate and/or the flexible substrate to separate the flexible substrate and the rigid substrate.

5. The method as claimed in claim 4, wherein a surface of the rigid substrate comprises a plurality of supporting pillars spaced apart from each other, the sealed plastic frame is formed in a periphery of the supporting pillars, and the flexible substrate within the sealed plastic frame adheres to the supporting pillars due to the negative pressure.

6. The method as claimed in claim 5, wherein the rigid substrate is a glass substrate, and the supporting pillars are glass supporting pillars formed by etching the glass substrate.

7. The method as claimed in claim 4, wherein the step of cutting the rigid substrate and/or the flexible substrate further comprises:
    cutting the flexible substrate along an internal side of the sealed plastic frame.

8. The method as claimed in claim 4, wherein the step of cutting the rigid substrate and/or the flexible substrate further comprises:
    cutting the flexible substrate along an internal side of the sealed plastic frame, and the sealed plastic frame and the remaining flexible substrate are removed from the rigid substrate.

* * * * *